United States Patent
Dunn

(10) Patent No.: US 12,207,452 B2
(45) Date of Patent: Jan. 21, 2025

(54) ELECTRONIC DISPLAY ASSEMBLY WITH THERMAL MANAGEMENT

(71) Applicant: Manufacturing Resources International, Inc., Alpharetta, GA (US)

(72) Inventor: William Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 18/656,927

(22) Filed: May 7, 2024

(65) Prior Publication Data
US 2024/0298431 A1  Sep. 5, 2024

Related U.S. Application Data

(63) Continuation of application No. 18/108,907, filed on Feb. 13, 2023, which is a continuation of application
(Continued)

(51) Int. Cl.
| | | |
|---|---|---|
| G02F 1/1333 | (2006.01) | |
| G02F 1/133 | (2006.01) | |
| H05K 7/20 | (2006.01) | |

(52) U.S. Cl.
CPC ..... *H05K 7/20972* (2013.01); *G02F 1/13306* (2013.01); *G02F 1/133308* (2013.01); *G02F 1/133385* (2013.01); *G02F 1/133314* (2021.01)

(58) Field of Classification Search
None
See application file for complete search history.

(56) References Cited

U.S. PATENT DOCUMENTS

| | | |
|---|---|---|
| 3,858,965 A | 1/1975 | Sumita |
| 4,093,355 A | 6/1978 | Kaplit et al. |
(Continued)

FOREIGN PATENT DOCUMENTS

| | | |
|---|---|---|
| AU | 2011248190 B2 | 5/2011 |
| AU | 2014287438 B2 | 1/2018 |
(Continued)

OTHER PUBLICATIONS

Mentley, David E., State of Flat-Panel Display Technology and Future Trends, Proceedings of the IEEE, Apr. 2002, vol. 90, No. 4, pp. 453-459.
(Continued)

*Primary Examiner* — Thanh Nhan P Nguyen
(74) *Attorney, Agent, or Firm* — Standley Law Group LLP; Jeffrey S. Standley; Adam J. Smith

(57) ABSTRACT

Electronic display assemblies are disclosed which include a housing, an electronic display located within the housing, a first airflow pathway extending through the housing between an intake and an exhaust and a second airflow pathway, separated from the first airflow pathway, and forming a closed, continuous pathway within the housing. A panel is spaced apart from the electronic display and at least partially defining and separating the first and second airflow pathways, where at least a portion of the first airflow pathway extends between a rear surface of the electronic display and a forward surface of the panel, and where at least a portion of the second airflow pathway extends between a rear surface of the panel and a forward surface of a rear portion of the housing. Electronic component(s) for operating the electronic display assembly are located within the second airflow pathway.

25 Claims, 9 Drawing Sheets

Related U.S. Application Data

No. 16/983,842, filed on Aug. 3, 2020, now abandoned, which is a continuation of application No. 15/135,032, filed on Apr. 21, 2016, now abandoned, and a continuation-in-part of application No. 12/234,307, filed on Sep. 19, 2008, now Pat. No. 8,767,165, and a continuation of application No. 12/234,360, filed on Sep. 19, 2008, now abandoned, which is a continuation-in-part of application No. 12/191,834, filed on Aug. 14, 2008, now Pat. No. 8,208,115, and a continuation-in-part of application No. 11/941,728, filed on Nov. 16, 2007, now Pat. No. 8,004,648.

(60) Provisional application No. 61/076,126, filed on Jun. 26, 2008, provisional application No. 61/057,599, filed on May 30, 2008, provisional application No. 61/053,713, filed on May 16, 2008, provisional application No. 61/039,454, filed on Mar. 26, 2008.

(56) References Cited

U.S. PATENT DOCUMENTS

| | | | |
|---|---|---|---|
| 4,292,370 | A | 9/1981 | Pekko |
| 4,327,803 | A | 5/1982 | Muellejans et al. |
| 4,488,193 | A | 12/1984 | Davis et al. |
| 4,593,978 | A | 6/1986 | Mourey et al. |
| 4,634,225 | A | 1/1987 | Haim et al. |
| 4,748,765 | A | 6/1988 | Martin |
| 4,763,993 | A | 8/1988 | Vogeley et al. |
| 4,896,218 | A | 1/1990 | Vick |
| 4,921,041 | A | 5/1990 | Akachi |
| 4,952,783 | A | 8/1990 | Aufderheide et al. |
| 4,952,925 | A | 8/1990 | Haastert |
| 4,976,536 | A | 12/1990 | Vogeley et al. |
| 5,002,118 | A | 3/1991 | Olmstead et al. |
| 5,029,982 | A | 7/1991 | Nash |
| 5,088,806 | A | 2/1992 | McCartney et al. |
| 5,132,666 | A | 7/1992 | Fahs |
| 5,150,231 | A | 9/1992 | Iwamoto et al. |
| 5,247,374 | A | 9/1993 | Terada |
| 5,255,029 | A | 10/1993 | Vogeley et al. |
| 5,282,114 | A | 1/1994 | Stone |
| 5,285,677 | A | 2/1994 | Oehler |
| 5,293,930 | A | 3/1994 | Pitasi |
| 5,351,176 | A | 9/1994 | Smith et al. |
| 5,432,526 | A | 7/1995 | Hyatt |
| 5,535,816 | A | 7/1996 | Ishida |
| 5,559,614 | A | 9/1996 | Urbish et al. |
| 5,621,614 | A | 4/1997 | O'Neill |
| 5,657,641 | A | 8/1997 | Cunningham et al. |
| 5,748,269 | A | 5/1998 | Harris et al. |
| 5,765,743 | A | 6/1998 | Sakiura et al. |
| 5,767,489 | A | 6/1998 | Ferrier |
| 5,808,418 | A | 9/1998 | Pitman et al. |
| 5,818,010 | A | 10/1998 | McCann |
| 5,818,694 | A | 10/1998 | Daikoku et al. |
| 5,835,179 | A | 11/1998 | Yamanaka |
| 5,864,465 | A | 1/1999 | Liu |
| 5,869,818 | A | 2/1999 | Kim |
| 5,869,919 | A | 2/1999 | Sato et al. |
| 5,903,433 | A | 5/1999 | Gudmundsson |
| 5,920,367 | A | 7/1999 | Kajimoto et al. |
| 5,991,153 | A | 11/1999 | Heady et al. |
| 6,003,015 | A | 12/1999 | Kang et al. |
| 6,007,205 | A | 12/1999 | Fujimori |
| 6,020,945 | A | 2/2000 | Sawai et al. |
| 6,043,979 | A | 3/2000 | Shim |
| 6,089,751 | A | 7/2000 | Conover et al. |
| 6,104,451 | A | 8/2000 | Matsuoka et al. |
| 6,125,565 | A | 10/2000 | Hillstrom |
| 6,157,432 | A | 12/2000 | Helbing |
| 6,181,070 | B1 | 1/2001 | Dunn et al. |
| 6,191,839 | B1 | 2/2001 | Briley et al. |
| 6,198,222 | B1 | 3/2001 | Chang |
| 6,211,934 | B1 | 4/2001 | Habing et al. |
| 6,215,655 | B1 | 4/2001 | Heady et al. |
| 6,244,333 | B1 | 6/2001 | Bergh et al. |
| 6,351,381 | B1 | 2/2002 | Bilski et al. |
| 6,359,390 | B1 | 3/2002 | Nagai |
| 6,392,727 | B1 | 5/2002 | Larson et al. |
| 6,405,463 | B1 | 6/2002 | Roddy et al. |
| 6,417,900 | B1 | 7/2002 | Shin et al. |
| 6,428,198 | B1 | 8/2002 | Saccomanno et al. |
| 6,437,673 | B1 | 8/2002 | Nishida et al. |
| 6,473,150 | B1 | 10/2002 | Takushima et al. |
| 6,476,883 | B1 | 11/2002 | Salimes et al. |
| 6,493,440 | B2 | 12/2002 | Gromatsky et al. |
| 6,496,236 | B1 | 12/2002 | Cole et al. |
| 6,504,713 | B1 | 1/2003 | Pandolfi et al. |
| 6,535,266 | B1 | 3/2003 | Nemeth et al. |
| 6,628,355 | B1 | 9/2003 | Takahara |
| 6,643,130 | B1 | 11/2003 | DeMarchis et al. |
| 6,683,639 | B2 | 1/2004 | Driessen-Olde Scheper et al. |
| 6,701,143 | B1 | 3/2004 | Dukach et al. |
| 6,714,410 | B2 | 3/2004 | Wellhofer |
| 6,727,468 | B1 | 4/2004 | Nemeth |
| 6,742,583 | B2 | 6/2004 | Tikka |
| 6,800,378 | B2 | 10/2004 | Hawa et al. |
| 6,807,051 | B2 | 10/2004 | Takahashi |
| 6,812,851 | B1 | 11/2004 | Dukach et al. |
| 6,825,828 | B2 | 11/2004 | Burke et al. |
| 6,833,992 | B2 | 12/2004 | Kusaka et al. |
| 6,839,104 | B2 | 1/2005 | Taniguchi et al. |
| 6,850,209 | B2 | 2/2005 | Mankins et al. |
| 6,885,412 | B2 | 4/2005 | Ohnishi et al. |
| 6,886,942 | B2 | 5/2005 | Okada et al. |
| 6,891,135 | B2 | 5/2005 | Pala et al. |
| 6,909,486 | B2 | 6/2005 | Wang et al. |
| 6,943,768 | B2 | 9/2005 | Cavanaugh et al. |
| 6,961,108 | B2 | 11/2005 | Wang et al. |
| 7,015,470 | B2 | 3/2006 | Faytlin et al. |
| 7,018,054 | B2 | 3/2006 | Miyashita et al. |
| 7,059,757 | B2 | 6/2006 | Shimizu |
| 7,083,285 | B2 | 8/2006 | Hsu et al. |
| 7,157,838 | B2 | 1/2007 | Thielemans et al. |
| 7,161,803 | B1 | 1/2007 | Heady |
| 7,164,586 | B2 | 1/2007 | Lin |
| 7,170,759 | B2 | 1/2007 | Soga |
| 7,190,416 | B2 | 3/2007 | Paukshto et al. |
| 7,190,587 | B2 | 3/2007 | Kim et al. |
| 7,209,349 | B2 | 4/2007 | Chien et al. |
| 7,210,839 | B2 | 5/2007 | Jung et al. |
| 7,212,403 | B2 | 5/2007 | Rockenfell |
| 7,259,964 | B2 | 8/2007 | Yamamura et al. |
| 7,269,023 | B2 | 9/2007 | Nagano |
| 7,284,874 | B2 | 10/2007 | Jeong et al. |
| 7,342,789 | B2 | 3/2008 | Hall et al. |
| 7,354,159 | B2 | 4/2008 | Nakamura et al. |
| 7,396,145 | B2 | 7/2008 | Wang et al. |
| 7,447,018 | B2 | 11/2008 | Lee et al. |
| 7,452,121 | B2 | 11/2008 | Cho et al. |
| 7,457,113 | B2 | 11/2008 | Kumhyr et al. |
| 7,466,546 | B2 | 12/2008 | Park |
| 7,480,140 | B2 | 1/2009 | Hara et al. |
| 7,492,589 | B2 | 2/2009 | Park |
| 7,518,864 | B2 | 4/2009 | Kimura |
| 7,535,543 | B2 | 5/2009 | Dewa et al. |
| 7,591,508 | B2 | 9/2009 | Chang |
| 7,602,469 | B2 | 10/2009 | Shin |
| D608,775 | S | 1/2010 | Leung |
| 7,667,964 | B2 | 2/2010 | Kang et al. |
| 7,682,047 | B2 | 3/2010 | Hsu et al. |
| 7,752,858 | B2 | 7/2010 | Johnson et al. |
| 7,753,567 | B2 | 7/2010 | Kang et al. |
| 7,762,707 | B2 | 7/2010 | Kim et al. |
| 7,800,706 | B2 | 9/2010 | Kim et al. |
| 7,813,124 | B2 | 10/2010 | Karppanen |
| 7,864,258 | B2 | 1/2011 | Cho et al. |
| 7,868,951 | B2 | 1/2011 | Maruta et al. |
| 7,903,416 | B2 | 3/2011 | Chou |
| 7,995,342 | B2 | 8/2011 | Nakamichi et al. |
| 8,004,648 | B2 | 8/2011 | Dunn |
| 8,035,968 | B2 | 10/2011 | Kwon et al. |

(56) References Cited

U.S. PATENT DOCUMENTS

| | | |
|---|---|---|
| 8,081,267 B2 | 12/2011 | Moscovitch et al. |
| 8,081,465 B2 | 12/2011 | Nishiura |
| 8,102,173 B2 | 1/2012 | Merrow |
| 8,102,483 B2 | 1/2012 | Perry et al. |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,462,497 B2 | 6/2013 | Li et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,562,770 B2 | 10/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,335,579 B2 | 5/2016 | Onoue |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,504,188 B1 | 11/2016 | Campbell et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,600,026 B2 | 3/2017 | Birgeoglu et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,857,618 B2 | 1/2018 | Barnes |
| 9,861,007 B2 | 1/2018 | Yoon et al. |
| 9,894,800 B2 | 2/2018 | Dunn |
| 10,070,540 B2 | 9/2018 | Campagna et al. |
| 10,080,316 B2 | 9/2018 | Dunn et al. |
| 10,088,702 B2 | 10/2018 | Dunn et al. |
| 10,165,712 B1 | 12/2018 | Jang et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,278,312 B1 | 4/2019 | Davis et al. |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,405,456 B2 | 9/2019 | Jang et al. |
| 10,409,323 B2 | 9/2019 | Birgeoglu et al. |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,488,896 B2 | 11/2019 | Simpson |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,747,261 B2 | 8/2020 | Birgeoglu et al. |
| 10,754,184 B2 | 8/2020 | Wang et al. |
| 10,757,844 B2 | 8/2020 | Dunn et al. |
| 10,795,413 B1 | 10/2020 | Dunn |
| 10,820,445 B2 | 10/2020 | Diaz |
| 10,827,656 B2 | 11/2020 | Hubbard |
| 10,827,657 B2 | 11/2020 | Lee |
| 10,905,035 B2 | 1/2021 | Whitehead et al. |
| 10,925,174 B2 | 2/2021 | Dunn et al. |
| 10,969,615 B2 | 4/2021 | Wang et al. |
| 10,973,156 B2 | 4/2021 | Dunn et al. |
| 10,983,382 B2 | 4/2021 | Takase |
| 11,013,142 B2 | 5/2021 | Dunn et al. |
| 11,016,547 B2 | 5/2021 | Whitehead et al. |
| 11,019,735 B2 | 5/2021 | Dunn |
| 11,032,923 B2 | 6/2021 | Dunn et al. |
| 11,096,317 B2 | 8/2021 | Dunn |
| 11,191,193 B2 | 11/2021 | Hubbard |
| 11,206,750 B2 | 12/2021 | Lee et al. |
| 11,470,749 B2 | 10/2022 | Dunn et al. |
| 11,477,923 B2 | 10/2022 | Brown |
| 11,507,141 B2 | 11/2022 | Dunn |
| 11,540,418 B2 | 12/2022 | Dunn et al. |
| 11,596,081 B2 | 2/2023 | Dunn et al. |
| 11,617,287 B2 | 3/2023 | Dunn |
| 11,744,036 B2 | 8/2023 | Diaz |
| 11,744,054 B2 | 8/2023 | Dunn et al. |
| 11,762,231 B2 | 9/2023 | Dunn et al. |

(56) References Cited

U.S. PATENT DOCUMENTS

| | | |
|---|---|---|
| 11,822,171 B2 | 11/2023 | Dunn et al. |
| 11,889,636 B2 | 1/2024 | Dunn |
| 11,919,393 B2 | 3/2024 | Dunn et al. |
| 11,934,054 B2 | 3/2024 | Dunn et al. |
| 11,966,263 B2 | 4/2024 | Dunn et al. |
| 11,968,813 B2 | 4/2024 | Dunn et al. |
| 2001/0001459 A1 | 5/2001 | Savant et al. |
| 2001/0009508 A1 | 7/2001 | Umemoto et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0122134 A1 | 9/2002 | Kalua |
| 2002/0126248 A1 | 9/2002 | Yoshida |
| 2002/0135741 A1 | 9/2002 | Lee et al. |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020679 A1 | 1/2003 | Kojima et al. |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0025389 A1 | 2/2004 | Peterson |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0207981 A1 | 10/2004 | Gorenz, Jr. et al. |
| 2004/0212548 A1 | 10/2004 | Ruttenberg |
| 2004/0223299 A1 | 11/2004 | Ghosh |
| 2004/0239823 A1 | 12/2004 | Silsby et al. |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0094039 A1 | 5/2005 | Kim et al. |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0077636 A1 | 4/2006 | Kim |
| 2006/0081366 A1 | 4/2006 | Chiu et al. |
| 2006/0081367 A1 | 4/2006 | Chiu et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0133090 A1 | 6/2006 | Noh et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0221270 A1 | 10/2006 | Ioki et al. |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0266900 A1 | 11/2006 | May et al. |
| 2006/0268194 A1 | 11/2006 | Morimoto et al. |
| 2006/0269216 A1 | 11/2006 | Wiemeyer et al. |
| 2006/0274237 A1 | 12/2006 | Nelson et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0021217 A1 | 1/2007 | Wu et al. |
| 2007/0030879 A1 | 2/2007 | Hatta |
| 2007/0046874 A1 | 3/2007 | Adachi et al. |
| 2007/0047239 A1 | 3/2007 | Kang et al. |
| 2007/0065091 A1 | 3/2007 | Hinata et al. |
| 2007/0070615 A1 | 3/2007 | Joslin et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0126335 A1 | 6/2007 | You et al. |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151164 A1 | 7/2007 | Marshall |
| 2007/0151274 A1 | 7/2007 | Roche et al. |
| 2007/0151664 A1 | 7/2007 | Shin |
| 2007/0171353 A1 | 7/2007 | Hong |
| 2007/0176885 A1 | 8/2007 | Jun |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0230167 A1 | 10/2007 | McMahon et al. |
| 2007/0237636 A1 | 10/2007 | Hsu |
| 2007/0253205 A1 | 11/2007 | Welker |
| 2007/0267174 A1 | 11/2007 | Kim |
| 2007/0274051 A1 | 11/2007 | Horng et al. |
| 2008/0035315 A1 | 2/2008 | Han |
| 2008/0054144 A1 | 3/2008 | Wohlford |
| 2008/0055261 A1 | 3/2008 | Cernasov |
| 2008/0055534 A1 | 3/2008 | Kawano |
| 2008/0076342 A1 | 3/2008 | Bryant et al. |
| 2008/0083527 A1 | 4/2008 | Horng et al. |
| 2008/0099193 A1 | 5/2008 | Aksamit et al. |
| 2008/0111936 A1* | 5/2008 | Kim .................. G02B 6/0085 349/58 |
| 2008/0148609 A1 | 6/2008 | Ogoreve |
| 2008/0165496 A1 | 7/2008 | Kang et al. |
| 2008/0190210 A1 | 8/2008 | Harish et al. |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0021461 A1 | 1/2009 | Hu et al. |
| 2009/0034188 A1 | 2/2009 | Sween et al. |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |

(56) References Cited

U.S. PATENT DOCUMENTS

| | | |
|---|---|---|
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0145581 A1 | 6/2009 | Hoffman et al. |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0251650 A1 | 10/2009 | Fukagawa et al. |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0142149 A1 | 6/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0315570 A1 | 12/2010 | Mathew et al. |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0051369 A1 | 3/2011 | Takahara |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0090630 A1 | 4/2011 | Bergeron et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0131936 A1 | 5/2012 | Yoshida et al. |
| 2012/0188481 A1 | 7/2012 | Kang et al. |
| 2012/0206687 A1 | 8/2012 | Dunn et al. |
| 2012/0223877 A1 | 9/2012 | Cho |
| 2012/0224116 A1 | 9/2012 | Barnes |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1 | 10/2013 | Dunn |
| 2013/0294039 A1 | 11/2013 | Chao |
| 2013/0299651 A1 | 11/2013 | McGowan et al. |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0268657 A1 | 9/2014 | Dunn et al. |
| 2014/0313452 A1 | 10/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1 | 1/2015 | Dunn et al. |
| 2015/0087404 A1 | 3/2015 | Lesley et al. |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2015/0371571 A1 | 12/2015 | Häger |
| 2016/0014910 A1 | 1/2016 | Campagna et al. |
| 2016/0041423 A1 | 2/2016 | Dunn |
| 2016/0044829 A1 | 2/2016 | Dunn |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0172016 A1 | 6/2017 | Kang |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0020579 A1 | 1/2018 | Chang et al. |
| 2018/0042134 A1 | 2/2018 | Dunn et al. |
| 2018/0088368 A1 | 3/2018 | Notoshi et al. |
| 2018/0088398 A1 | 3/2018 | Lee et al. |
| 2018/0116073 A1 | 4/2018 | Dunn |
| 2018/0199450 A1 | 7/2018 | Kim et al. |
| 2018/0259806 A1 | 9/2018 | Oh et al. |
| 2018/0263142 A1 | 9/2018 | Oh et al. |
| 2018/0310439 A1 | 10/2018 | Oh et al. |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |

(56) References Cited

U.S. PATENT DOCUMENTS

| | | |
|---|---|---|
| 2019/0021189 A1 | 1/2019 | Kim et al. |
| 2019/0037738 A1 | 1/2019 | Dunn et al. |
| 2019/0089176 A1 | 3/2019 | Dunn et al. |
| 2019/0133002 A1 | 5/2019 | Dunn et al. |
| 2019/0159363 A1 | 5/2019 | Jang et al. |
| 2019/0208674 A1 | 7/2019 | Demars |
| 2019/0239365 A1 | 8/2019 | Dunn et al. |
| 2019/0289754 A1 | 9/2019 | Hubbard |
| 2019/0327865 A1 | 10/2019 | Dunn et al. |
| 2020/0096797 A1 | 3/2020 | Teragawa |
| 2020/0154597 A1 | 5/2020 | Dunn et al. |
| 2020/0163235 A1 | 5/2020 | Dunn |
| 2020/0201402 A1 | 6/2020 | Lee et al. |
| 2020/0205303 A1 | 6/2020 | Dunn et al. |
| 2020/0241612 A1 | 7/2020 | Moon et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0319676 A1 | 10/2020 | Dunn |
| 2020/0352049 A1 | 11/2020 | Dunn et al. |
| 2020/0367391 A1 | 11/2020 | Dunn |
| 2020/0369169 A1 | 11/2020 | Mercer et al. |
| 2020/0387194 A1 | 12/2020 | Dunn |
| 2020/0390009 A1 | 12/2020 | Whitehead et al. |
| 2021/0007241 A1 | 1/2021 | Diaz |
| 2021/0022273 A1 | 1/2021 | Hubbard |
| 2021/0165472 A1 | 6/2021 | Chin |
| 2021/0168949 A1 | 6/2021 | Dunn et al. |
| 2021/0231998 A1 | 7/2021 | Noso et al. |
| 2021/0243906 A1 | 8/2021 | Dunn |
| 2021/0243914 A1 | 8/2021 | Dunn |
| 2021/0304644 A1 | 9/2021 | Webster |
| 2021/0307214 A1 | 9/2021 | Zhang et al. |
| 2021/0345528 A1 | 11/2021 | Dunn |
| 2021/0400853 A1 | 12/2021 | Choi |
| 2021/0408676 A1 | 12/2021 | Sainz Fuertes |
| 2022/0035198 A1 | 2/2022 | Dunn et al. |
| 2022/0110227 A1 | 4/2022 | Brown |
| 2022/0121255 A1 | 4/2022 | Wang et al. |
| 2022/0132707 A1 | 4/2022 | Dunn et al. |
| 2022/0287200 A1 | 9/2022 | Dunn et al. |
| 2022/0394861 A1 | 12/2022 | Dunn et al. |
| 2022/0408616 A1 | 12/2022 | Brown |
| 2022/0408617 A1 | 12/2022 | Brown |
| 2023/0030742 A1 | 2/2023 | Dunn et al. |
| 2023/0032626 A1 | 2/2023 | Brown |
| 2023/0033017 A1 | 2/2023 | Dunn |
| 2023/0036767 A1 | 2/2023 | Dunn et al. |
| 2023/0056061 A1 | 2/2023 | Dunn et al. |
| 2023/0059819 A1 | 2/2023 | Dunn et al. |
| 2023/0160774 A1 | 5/2023 | Dunn et al. |
| 2023/0164964 A1 | 5/2023 | Dunn et al. |
| 2023/0200031 A1 | 6/2023 | Dunn |
| 2023/0209786 A1 | 6/2023 | Dunn |
| 2023/0345683 A1 | 10/2023 | Dunn et al. |
| 2023/0359077 A1 | 11/2023 | Dunn et al. |
| 2023/0422431 A1 | 12/2023 | Dunn et al. |
| 2023/0422453 A1 | 12/2023 | Dunn |
| 2024/0032238 A1 | 1/2024 | Dunn et al. |
| 2024/0114633 A1 | 4/2024 | Dunn |

FOREIGN PATENT DOCUMENTS

| | | |
|---|---|---|
| AU | 2015253128 B2 | 3/2018 |
| AU | 2017216500 B2 | 10/2018 |
| AU | 2015229457 B2 | 3/2019 |
| AU | 2016220308 B2 | 3/2019 |
| AU | 2017228430 B2 | 3/2020 |
| AU | 2018258497 B2 | 1/2021 |
| AU | 2018257648 B2 | 2/2021 |
| BR | PI0820231-1 | 2/2019 |
| CA | 2705814 C | 2/2018 |
| CA | 2947524 C | 4/2018 |
| CA | 2915261 C | 8/2018 |
| CA | 2798277 C | 6/2019 |
| CA | 2809019 C | 9/2019 |
| CA | 2888494 C | 9/2019 |
| CA | 2976116 C | 11/2020 |
| CA | 3015365 C | 8/2021 |
| CA | 3059972 C | 1/2022 |
| CA | 2942321 C | 6/2022 |
| CA | 3059928 C | 11/2022 |
| CN | 2702363 Y | 5/2005 |
| CN | 201228893 Y | 4/2009 |
| CN | 202838830 U | 3/2013 |
| CN | 106304788 A | 1/2017 |
| CN | 107251671 A | 10/2017 |
| CN | 108700739 A | 10/2018 |
| CN | 107251671 B | 8/2019 |
| CN | 216697703 U | 6/2022 |
| EP | 1408476 A1 | 4/2004 |
| EP | 1647766 A2 | 4/2006 |
| EP | 1722559 A1 | 11/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2587175 A1 | 5/2013 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3040766 A1 | 7/2016 |
| EP | 3117693 A2 | 1/2017 |
| EP | 3259968 A1 | 12/2017 |
| EP | 3423886 A0 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| EP | 3624574 A1 | 3/2020 |
| EP | 3468321 B1 | 4/2021 |
| EP | 3423886 B1 | 2/2022 |
| EP | 3259968 B1 | 4/2022 |
| EP | 4232870 A1 | 8/2023 |
| EP | 3615978 B1 | 1/2024 |
| FR | 2893752 A1 | 5/2007 |
| GB | 2402205 A | 12/2004 |
| JP | 402062015 A | 3/1990 |
| JP | 402307080 A | 12/1990 |
| JP | 3153212 A | 7/1991 |
| JP | H497194 A | 3/1992 |
| JP | H06-2337 U | 1/1994 |
| JP | 6082745 A | 3/1994 |
| JP | H8-54834 A | 2/1996 |
| JP | H8-55567 A | 2/1996 |
| JP | 8115788 A | 5/1996 |
| JP | H8-152604 A | 6/1996 |
| JP | 8194437 A | 7/1996 |
| JP | H08-305301 A | 11/1996 |
| JP | 8339034 A | 12/1996 |
| JP | H9-160512 A | 6/1997 |
| JP | H09246766 A | 9/1997 |
| JP | H10152604 A | 6/1998 |
| JP | H-10222076 A | 8/1998 |
| JP | H11-68363 A | 3/1999 |
| JP | 11160727 A | 6/1999 |
| JP | H-11233967 A | 8/1999 |
| JP | H11296094 A | 10/1999 |
| JP | 2000-10501 A | 1/2000 |
| JP | 2000112033 A | 4/2000 |
| JP | 2000131682 A | 5/2000 |
| JP | 3118907 B2 | 10/2000 |
| JP | 2001209125 A | 8/2001 |
| JP | 2001209126 A | 8/2001 |
| JP | 2001326488 A | 11/2001 |
| JP | 2002-6282 A | 1/2002 |
| JP | 2002006757 A | 1/2002 |
| JP | 2002148714 A | 5/2002 |
| JP | 2002158475 A | 5/2002 |
| JP | 2003036032 A | 2/2003 |

(56) References Cited

FOREIGN PATENT DOCUMENTS

| | | |
|---|---|---|
| JP | 2003-76286 A | 3/2003 |
| JP | 2003-162228 A | 6/2003 |
| JP | 2003173147 A | 6/2003 |
| JP | 2004053749 A | 2/2004 |
| JP | 2004-199675 A | 7/2004 |
| JP | 2004193002 A | 7/2004 |
| JP | 2004285940 A | 10/2004 |
| JP | 2004286940 A | 10/2004 |
| JP | 2005017434 A | 1/2005 |
| JP | 2005017556 A | 1/2005 |
| JP | 2005134849 A | 5/2005 |
| JP | 2005181799 A | 7/2005 |
| JP | 2005265922 A | 9/2005 |
| JP | 2005292939 A | 10/2005 |
| JP | 2005332253 A | 12/2005 |
| JP | 2006010851 A | 1/2006 |
| JP | 2006-32890 A | 2/2006 |
| JP | 2006513577 A | 4/2006 |
| JP | 2006148047 A | 6/2006 |
| JP | 2006163217 A | 6/2006 |
| JP | 2006-176112 A | 7/2006 |
| JP | 2006198344 A | 8/2006 |
| JP | 2006293062 A | 10/2006 |
| JP | 2006317494 A | 11/2006 |
| JP | 2006-330196 A | 12/2006 |
| JP | 2007003638 A | 1/2007 |
| JP | 2007052951 A | 3/2007 |
| JP | 2007207595 A | 8/2007 |
| JP | 2007-293105 A | 11/2007 |
| JP | 09307257 A | 11/2007 |
| JP | 2007322718 A | 12/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-118130 A | 6/2012 |
| JP | 2012-133254 A | 7/2012 |
| JP | 2013-537721 A | 10/2013 |
| JP | 2014-225595 A | 12/2014 |
| JP | 6039450 B2 | 12/2016 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| JP | 6824440 B2 | 1/2021 |
| JP | 6858276 B2 | 3/2021 |
| KR | 20000000118 U | 1/2000 |
| KR | 200163508 Y1 | 7/2000 |
| KR | 20000047899 A | 7/2000 |
| KR | 200206768 Y1 | 12/2000 |
| KR | 20010044073 A | 6/2001 |
| KR | 200236278 Y1 | 10/2001 |
| KR | 10-2067751 B1 | 1/2002 |
| KR | 200286961 Y1 | 8/2002 |
| KR | 100673470 B1 | 1/2004 |
| KR | 1020040067701 A | 7/2004 |
| KR | 200366674 Y1 | 11/2004 |
| KR | 20050033986 A | 4/2005 |
| KR | 20050036254 A | 4/2005 |
| KR | 200401354 Y1 | 11/2005 |
| KR | 20060016469 A | 2/2006 |
| KR | 10-0563049 B1 | 3/2006 |
| KR | 20060054742 A | 5/2006 |
| KR | 10-2006-0070176 A | 6/2006 |
| KR | 20060091898 A | 8/2006 |
| KR | 20060120904 A | 11/2006 |
| KR | 100659339 B1 | 12/2006 |
| KR | 100666961 B1 | 1/2007 |
| KR | 20070002494 A | 1/2007 |
| KR | 1020070070675 A | 4/2007 |
| KR | 10-2007-0048300 A | 5/2007 |
| KR | 20070048296 A | 5/2007 |
| KR | 1020070048294 | 8/2007 |
| KR | 20080005024 A | 1/2008 |
| KR | 20080010091 A | 1/2008 |
| KR | 20080018486 A | 2/2008 |
| KR | 20080047241 A | 5/2008 |
| KR | 20090116368 A | 11/2009 |
| KR | 10-1153923 B1 | 6/2012 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| KR | 10-2165778 B1 | 10/2020 |
| KR | 10-2262912 B1 | 6/2021 |
| KR | 10-2267374 B1 | 6/2021 |
| KR | 10-2306650 B1 | 9/2021 |
| KR | 10-2379046 B1 | 3/2022 |
| KR | 10-2400990 B1 | 5/2022 |
| KR | 10-2501211 B1 | 2/2023 |
| RU | 2513043 C2 | 4/2014 |
| WO | WO2005079129 A1 | 8/2005 |
| WO | WO2007/116117 A1 | 10/2007 |
| WO | WO2007116116 A1 | 10/2007 |
| WO | WO2008050660 A2 | 5/2008 |
| WO | WO2008085138 A | 7/2008 |
| WO | WO2008/102050 A1 | 8/2008 |
| WO | WO2009/047390 A1 | 4/2009 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A2 | 11/2011 |
| WO | WO2011150078 A2 | 12/2011 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015/138609 A2 | 9/2015 |
| WO | WO2015168375 A1 | 11/2015 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |
| WO | WO2020/081687 A1 | 4/2020 |
| WO | WO2020/205305 A1 | 10/2020 |
| WO | WO2022/087488 A1 | 4/2022 |
| WO | WO2023/096738 A1 | 6/2023 |
| WO | WO2024/020185 A1 | 1/2024 |

OTHER PUBLICATIONS

Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC.* V *Manufacturing Resources International, Inc.*, Petition for Inter Partes Review of U.S. Pat. No. 8,854,572 including Declaration of Greg Blonder in Support of Petition,

(56) References Cited

OTHER PUBLICATIONS

Curriculum Vitae of Greg Blonder and Prosecution History of U.S. Pat. No. 8,854,572, Petition filed Mar. 14, 2018, 427 pages.
*Civiq Smartscapes Llc. V Manufacturing Resources International, Inc.*, Defendant's Amended Answer and Countercliams to Plaintiff's First Amended Complaint, Filed Apr. 24, 2018, 240 pages.
*Civiq Smartscapes, Llc V. Manufacturing Resources International, Inc.*, Memorandum Order re "rear surface of the electronic display" term construction, Mar. 5, 2019, 3 pages.
*United States International Trade Commission, Manufacturing Resources International, Inc. v Samsung Electronics Co., Ltd et al.*, In the Matter of Certain Outdoor and Semioutdoor Electronic Displays, Products Containing Same, and Components Thereof, Inv. No. 337-TA-1331, Final Initial Determination of Violation of Section 337, Public Version, Nov. 13, 2023, 325 pages.
Declaration of Robert Smith Gillespie, Certain Outdoor and Semi-outdoor Electronic Displays, Products, Containing same, and Components thereof, Jan. 17, 2023, 42 pages.
*Samsung Electronics Co., Ltd and Samsung Electronics America, Inc. v Manufacturing Resources International, Inc.*, Declaration of Michael Gershowitz, Sep. 26, 2023, 77 pages.
*Samsung Electronics Co., Ltd and Samsung Electronics America, Inc. v Manufacturing Resources International, Inc.*, Expert Declaration of Dr. Himanshu Pokhama,, Sep. 26, 2023, 104 pages.
*Samsung Electronics Co., Ltd and Samsung Electronics America, Inc. v Manufacturing Resources International, Inc.*, Decision to Institute IPR2023-00199, Jun. 20, 2023, 53 pages.
*Samsung Electronics Co., Ltd and Samsung Electronics America, Inc. v Manufacturing Resources International, Inc.*, Decision to Institute IPR2023-00220, Jun. 20, 2023, 51 pages.
*Samsung Electronics Co., Ltd and Samsung Electronics America, Inc. v Manufacturing Resources International, Inc.*, Decision to Institute IPR2023-00221, Jun. 20, 2023, 80 pages.
*Samsung Electronics Co., Ltd and Samsung Electronics America, Inc. v Manufacturing Resources International, Inc.*, Decision to Institute IPR2023-00254, Jun. 20, 2023, 72 pages.
*Samsung Electronics Co., Ltd and Samsung Electronics America, Inc. v Manufacturing Resources International, Inc.*, Decision to Institute IPR2023-00255, Jul. 18, 2023, 47 pages.
Itsenclosures, Product Catalog, 2009, 48 pages.
Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMCanalysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
Adnation, Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A—Appendix D, Jan. 24, 2018, 51 pages.
Civiq, Invalidity Contentions, Jan. 24, 2018, 51 pages.
Scott, Cooling of Electronic Equipment, Apr. 4, 1974, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC V. Manufacturing Resources International, Inc.*, Memorandum Opinion re claim construction, Sep. 27, 2018, 16 pages.
*Civiq Smartscapes, LLC V. Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.
*Samsung Electronics Co., Ltd and Samsung Electronics America, Inc. v Manufacturing Resources International, Inc.*, Final Written Decision IPR2023-00199, Jul. 3, 2024, 78 pages.
*Samsung Electronics Co., Ltd and Samsung Electronics America, Inc. v Manufacturing Resources International, Inc.*, Final Written Decision IPR2023-00220, Jul. 3, 2024, 78 pages.
*Samsung Electronics Co., Ltd and Samsung Electronics America, Inc. v Manufacturing Resources International, Inc.*, Final Written Decision IPR2023-00254, Jul. 3, 2024, 114 pages.
*Samsung Electronics Co., Ltd and Samsung Electronics America, Inc. v Manufacturing Resources International, Inc.*, Final Written Decision IPR2023-00221, Jul. 3, 2024, 116 pages.
*Samsung Electronics Co., Ltd and Samsung Electronics America, Inc. v Manufacturing Resources International, Inc.*, Final Written Decision IPR2023-00255, Jul. 30, 2024, 94 pages.

\* cited by examiner

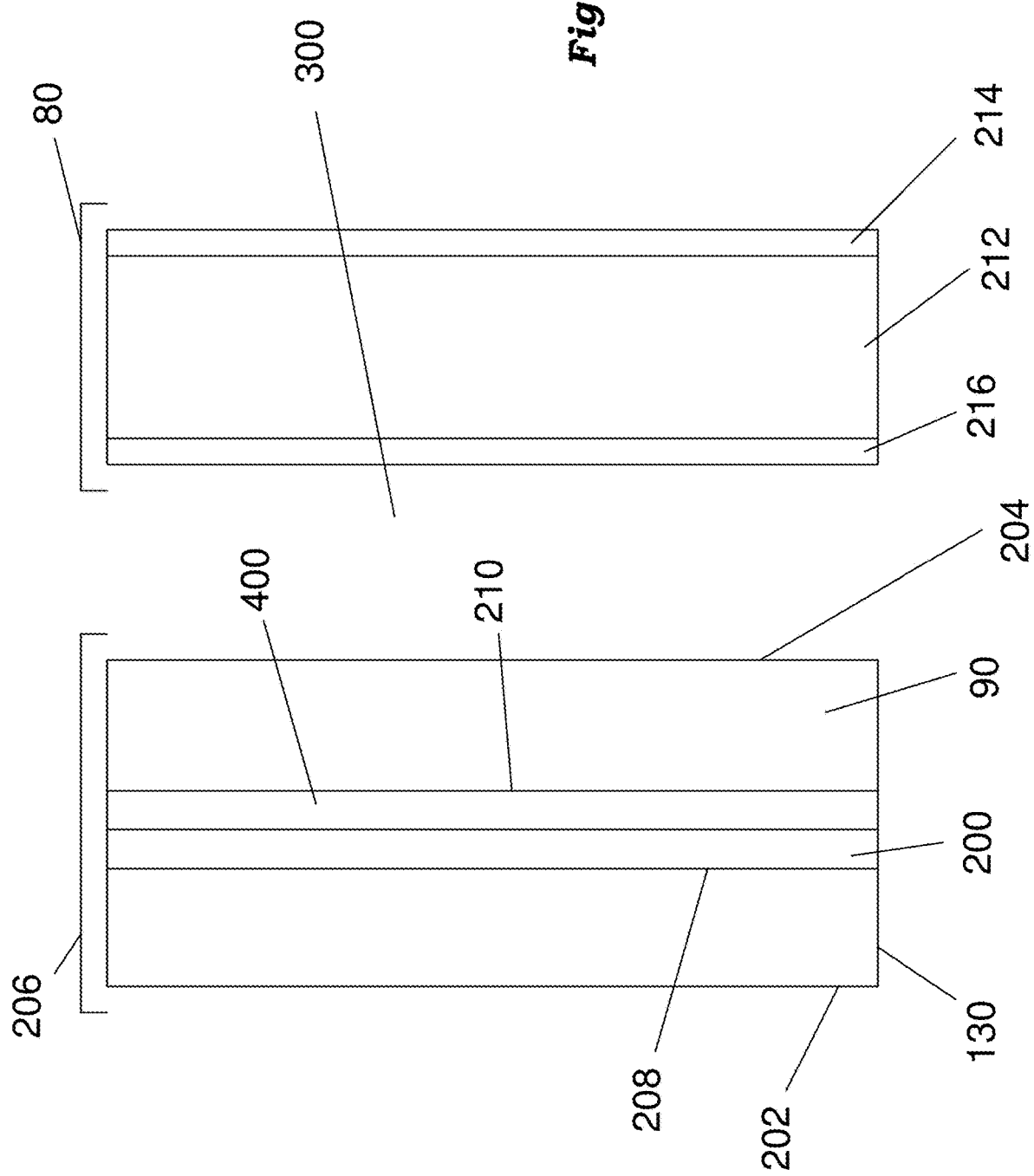

ELECTRONIC DISPLAY ASSEMBLY WITH THERMAL MANAGEMENT

CROSS-REFERENCE TO RELATED APPLICATIONS

This application is a continuation of U.S. patent application Ser. No. 18/108,907 filed Feb. 13, 2023, which is a continuation of U.S. patent application Ser. No. 16/983,842 filed Aug. 3, 2020, which is a continuation of U.S. patent application Ser. No. 15/135,032 filed Apr. 21, 2016, which is a continuation of U.S. patent application Ser. No. 12/234,360 filed Sep. 19, 2008. U.S. patent application Ser. No. 12/234,360 is a non-provisional of U.S. Provisional Application Nos. 61/053,713 filed May 16, 2008, 61/039,454 filed Mar. 26, 2008, 61/057,599 filed May 30, 2008, and 61/076,126 filed Jun. 26, 2008. U.S. patent application Ser. No. 12/234,360 is also a continuation-in-part of U.S. patent application Ser. No. 11/941,728 filed Nov. 16, 2007, now U.S. Pat. No. 8,004,648 issued Aug. 23, 2011. U.S. patent application Ser. No. 12/234,360 is also a continuation-in-part of U.S. patent application Ser. No. 12/191,834 filed Aug. 14, 2008, now U.S. Pat. No. 8,208,115 issued Jun. 26, 2012. U.S. patent application Ser. No. 12/234,360 is also a continuation-in-part of U.S. patent application Ser. No. 12/234,307 filed Sep. 19, 2008, now U.S. Pat. No. 8,767,165 issued Jul. 1, 2014; each of the aforementioned applications are hereby incorporated by reference in their entirety as if fully cited herein.

TECHNICAL FIELD

Exemplary embodiments generally relate to cooling systems and in particular to cooling systems for cooling electronic displays and their electronic components.

BACKGROUND OF THE ART

Conductive and convective heat transfer systems for electronic displays are known. These systems of the past generally attempt to remove heat from the electronic components in a display through as many sidewalls of the display as possible. In order to do this, the systems of the past have relied primarily on fans for moving air past the components to be cooled and out of the display. In some cases, the heated air is moved into convectively thermal communication with fins. Some of the past systems also utilize conductive heat transfer from heat producing components directly to heat conductive housings for the electronics. In these cases, the housings have a large surface area, which is in convective communication with ambient air outside the housings. Thus, heat is transferred convectively or conductively to the housing and is then transferred into the ambient air from the housing by natural convection.

While such heat transfer systems have enjoyed a measure of success in the past, improvements to displays require even greater cooling capabilities.

SUMMARY OF THE EXEMPLARY EMBODIMENTS

In particular, cooling devices for electronic displays of the past have generally used convective heat dissipation systems that function to cool an entire interior of the display by one or more fans and fins, for example. By itself, this is not adequate in many climates, especially when radiative heat transfer from the sun through a display window becomes a major factor. In many applications and locations 200 Watts or more of power through such a display window is common. Furthermore, the market is demanding larger screen sizes for displays. With increased electronic display screen size and corresponding display window size more heat will be generated and more heat will be transmitted into the displays.

In the past, many displays have functioned satisfactorily with ten or twelve inch screens. Now, many displays are in need of screens having sizes greater than or equal to twenty-four inches that may require improved cooling systems. For example, some outdoor applications call for forty-seven inch screens and above. With increased heat production with the larger screens and radiative heat transfer from the sun through the display window, heat dissipation systems of the past, which attempt to cool the entire interior of the display with fins and fans, are no longer adequate.

A large fluctuation in temperature is common in the devices of the past. Such temperature fluctuation adversely affects the electronic components in these devices. Whereas the systems of the past attempted to remove heat only through the non-display sides and rear components of the enclosure surrounding the electronic display components, a preferred embodiment causes heat transfer from the face of the display as well. By the aspects described below, embodiments have made consistent cooling possible for electronic displays having screens of sizes greater than or equal to twelve inches. For example, cooling of a 55 inch screen can be achieved, even in extremely hot climates. Greater cooling capabilities are provided by the device and method described and shown in more detail below.

An exemplary embodiment relates to an isolated gas cooling system and a method for cooling the electronic components of an electronic display. An exemplary embodiment includes an isolated gas cooling chamber. The gas cooling chamber is preferably a closed loop which includes a first gas chamber comprising a transparent anterior plate and a second gas chamber comprising a cooling plenum. The first gas chamber is anterior to and coextensive with the viewable face of the electronic display surface. The transparent anterior plate may be set forward of the electronic display surface by spacers defining the depth of the first gas chamber. A cooling chamber fan, or equivalent means, may be located within the cooling plenum. The fan may be used to propel gas around the isolated gas cooling chamber loop. As the gas traverses the first gas chamber it contacts the electronic display surface, absorbing heat from the surface of the display. Because the gas and the relevant surfaces of the first gas chamber are transparent, the image quality remains excellent. After the gas has traversed the transparent first gas chamber, the gas may be directed into the rear cooling plenum. Located within the rear cooling plenum can be any number of electronic components which may be used to run the display. These components may include but are not limited to: transformers, circuit boards, resistors, capacitors, batteries, power transformers, motors, illumination devices, wiring and wiring harnesses, and switches.

In order to cool the gas in the plenum, external convective or conductive means may be employed. In at least one embodiment, an external fan unit may be utilized to blow cool air over the exterior surfaces of the plenum. The heat from the warm gas may radiate into the walls of the plenum and then escape the walls of the plenum by convection or conduction or a combination of both. The external fan unit may be positioned at the base of the housing for the entire display. Once the air is heated by flowing over the exterior surfaces of the plenum, the heated air may exit the housing as exhaust. Note, that the air from this external fan should not enter the isolated cooling system as this would introduce dust and contaminates into the otherwise clean air.

The foregoing and other features and advantages will be apparent from the following more detailed description of the particular embodiments, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which:

FIG. 12 is a cross-sectional view through one exemplary embodiment.

DETAILED DESCRIPTION

Embodiments relate to a cooling system for the electronic components of an electronic display and to combinations of the cooling system and the electronic display. Exemplary embodiments provide an isolated gas cooling system for an electronic display. Such an isolated gas cooling system is the subject matter of U.S. Application No. 61/033,064, incorporated by reference herein.

Figure 1:
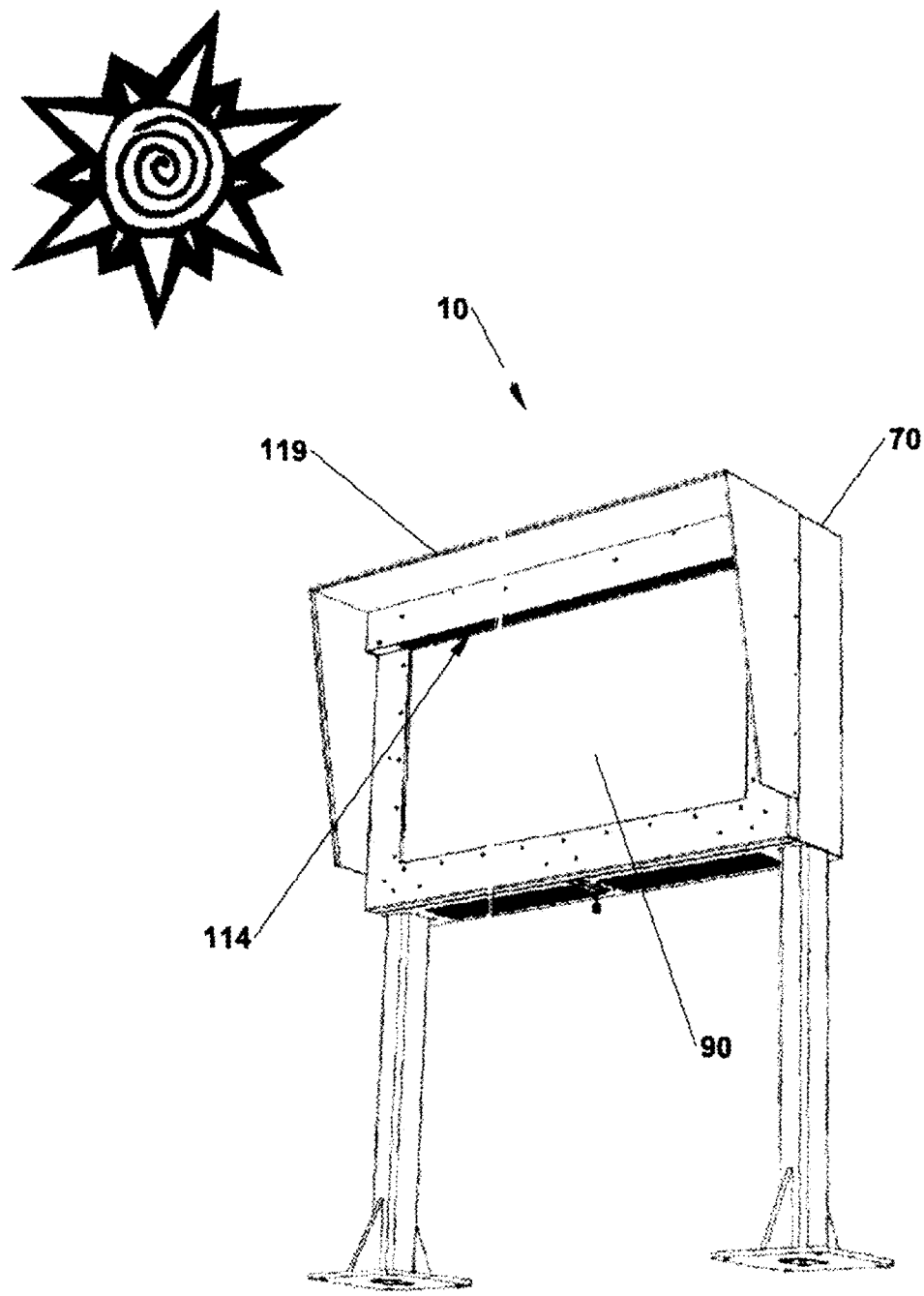
FIG. 1 is a perspective view of an exemplary embodiment in conjunction with an exemplary electronic display.

As shown in FIG. 1, when the display 10 is exposed to outdoor elements, the temperatures inside the display 10 will vary greatly without some kind of cooling device. As such, the electronics including the display screen (e.g., LCD screen) will have a greatly reduced life span. By implementing certain embodiments of the cooling system disclosed herein, temperature fluctuation is greatly reduced. This cooling capability has been achieved in spite of the fact that larger screens generate more heat than smaller screens.

The display shown is equipped with an innovative gas cooling system. Accordingly, it may be placed in direct sunlight. Although the cooling system may be used on smaller displays, it is especially useful for larger LCD, LED, or organic light emitting diodes (OLED) displays. These screens, especially with displays over 24 inches, face significant thermoregulatory issues in outdoor environments.

In FIG. 1, the display area of the electronic display shown includes a narrow gas chamber that is anterior to and coextensive with the electronic display surface. The display shown also is equipped with an optional air curtain device 114 which is the subject matter of co-pending U.S. application Ser. No. 11/941,728, incorporated by reference herein. Optionally, the display also has a reflection shield 119, to mitigate reflection of the sunlight on the display surface. Additionally, in outdoor environments, housing 70 is preferably a color which reflects sunlight.

It is to be understood that the spirit and scope of the disclosed embodiments includes cooling of displays including, but not limited to LCDs. By way of example and not by way of limitation, exemplary embodiments may be used in conjunction with displays selected from among LCD (including TFT or STN type), light emitting diode (LED), organic light emitting diode (OLED), field emitting display (FED), cathode ray tube (CRT), and plasma displays. Furthermore, embodiments may be used with displays of other types including those not yet discovered. In particular, it is contemplated that the system may be well suited for use with full color, flat panel OLED displays. While the embodiments described herein are well suited for outdoor environments, they may also be appropriate for indoor applications (e.g., factory environments) where thermal stability of the display may be at risk.

Figure 2:
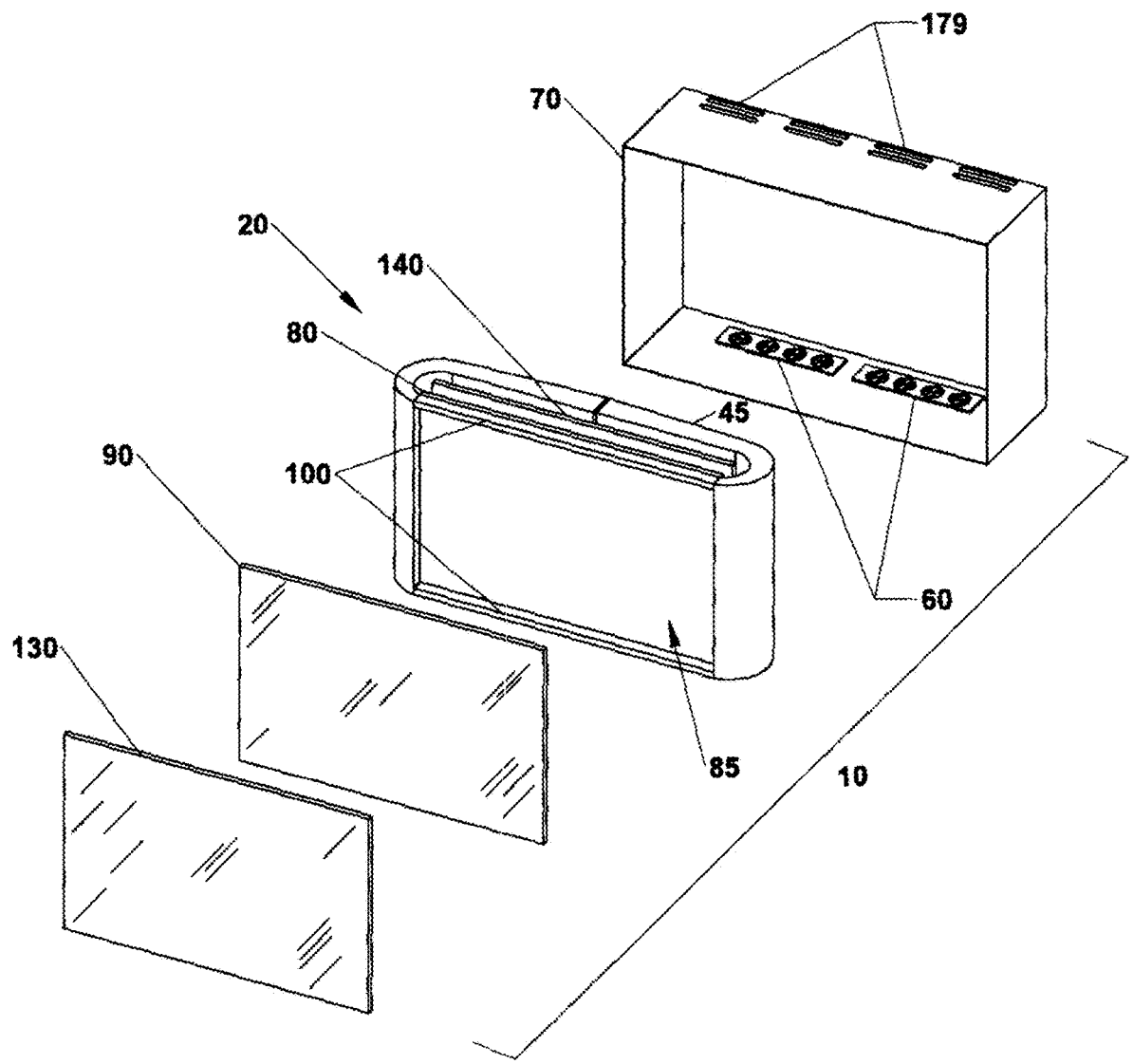
FIG. 2 is an exploded perspective view of an exemplary embodiment showing components of the isolated gas cooling system.

As shown in FIG. 2 an exemplary embodiment 10 of the electronic display and gas cooling system includes an isolated gas cooling chamber 20 contained within an electronic display housing 70. A narrow transparent first gas chamber is defined by spacers 100 and transparent front plate 90. A second transparent front plate 130 may be laminated to front plate 90 to help prevent breakage of front glass 90. As shown in FIG. 2, cooling chamber 20 may surround LCD stack 80 and associated backlight panel 140.

The gas cooling system 10 shown in FIG. 2 may include means for cooling gas contained within the second gas chamber. These means may include a fan 60 which may be positioned at the base of the display housing 70. The fan will force the cooler ingested air over the exterior surfaces of a posterior cooling plenum 45. If desired, an air conditioner (not shown) may also be utilized to cool the air which contacts the external surfaces of plenum 45.

Figure 3:
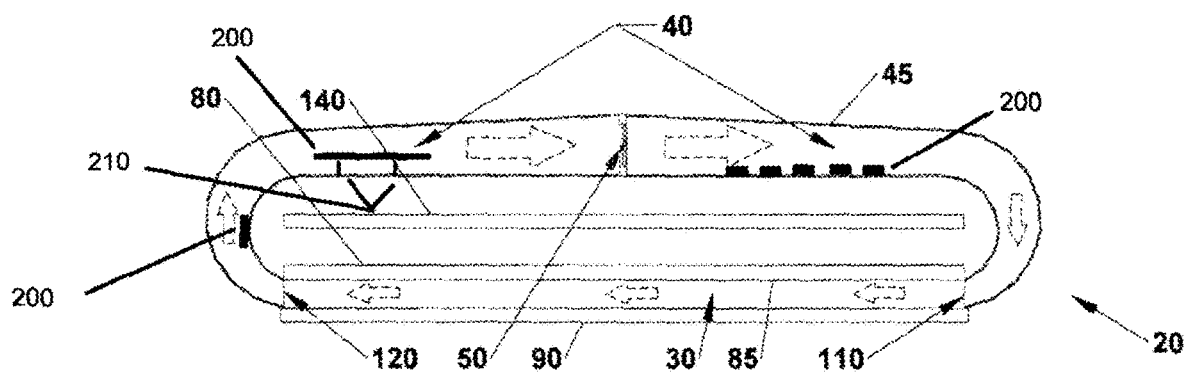
FIG. 3 is top plan view of an exemplary embodiment of the cooling chamber.

Referring to FIG. 3, in at least one embodiment the isolated gas cooling chamber 20 comprises a closed loop which includes a first gas chamber 30 (see FIG. 3) and a second gas chamber 40. The first gas chamber includes a transparent plate 90. The second gas chamber comprises a cooling plenum 45. The term "isolated gas" refers to the fact that the gas within the isolated gas cooling chamber 20 is essentially isolated from external air in the housing of the display. Because the first gas chamber 30 is positioned in front of the display image, the gas should be substantially free of dust or other contaminates that might negatively affect the display image.

Various electronic components 200 are shown in various positions throughout the plenum 45. Placing these components 200 within the plenum allows for increased air flow around the components 200 and increased cooling. Further, location of the components 200 within the plenum 45 can help satisfy space considerations, as well as manufacturing and repair considerations. These components 200 may be mounted directly on the walls or surfaces of the plenum 45, or may be suspended by rods or posts 210. The precise mounting of the components 200 can vary depending on the amount of cooling that is required for the component, manufacturing limitations, wire routing benefits, or ease of repair or replacement of the specific component. Further, the precise wiring of the components 200 can vary depending on similar factors. The wiring may pass through a single hole in the plenum 45 and then spread to each component or there may be various holes in the plenum 45 to accommodate the wiring for each component individually. In a further embodiment, PCB boards and other typical electronic mounting surfaces may be integrated into the plenum 45 such that the mounting board itself substitutes as a portion of the plenum wall.

The isolated gas may be almost any transparent gas, for example, normal air, nitrogen, helium, or any other transparent gas. The gas is preferably colorless so as not to affect the image quality. Furthermore, the isolated gas cooling chamber need not necessarily be hermetically sealed from the external air. It is sufficient that the gas in the chamber is isolated to the extent that dust and contaminates may not substantially enter the first gas chamber.

In the closed loop configuration shown in FIG. 3, the first gas chamber 30 is in gaseous communication with the second gas chamber 40. A cooling chamber fan 50 may be provided within the posterior plenum 45. The cooling fan 50 may be utilized to propel gas around the isolated gas cooling chamber 20. The first gas chamber 30 includes at least one front glass 90 mounted in front of an electronic display surface 85. The front glass 90 may be set forward from the electronic display surface 85 by spacers 100 (see FIG. 4). The spacing members 100 define the depth of the narrow channel passing in front of the electronic display surface 85. The spacing members 100 may be independent or alternatively may be integral with some other component of the device (e.g., integral with the front plate). The electronic display surface 85, the spacing members, and the transparent front plate 90 define a narrow first gas chamber 30. The chamber 30 is in gaseous communication with plenum 45 through entrance opening 110 and exit opening 120.

As shown in FIG. 3, a posterior surface of the first gas chamber 30 preferably comprises the electronic display surface 85 of the display stack 80. As the isolated gas in the first gas chamber 30 traverses the display it contacts the electronic display surface 85. Contacting the cooling gas directly to the electronic display surface 85 enhances the convective heat transfer away from the electronic display surface 85.

Advantageously, in exemplary embodiments the electronic display surface 85 comprises the posterior surface of the first gas chamber 30. Accordingly, the term "electronic display surface" refers to the front surface of a typical electronic display (in the absence of the embodiments disclosed herein). The term "viewable surface" or "viewing surface" refers to that portion of the electronic display surface from which the electronic display images may be viewed by the user.

The electronic display surface 85 of typical displays is glass. However, neither display surface 85, nor transparent front plate 90, nor optional second transparent front plate 130 need necessarily be glass. Therefore, the term "glass" will be used herein interchangeably with the term plate. By utilizing the electronic display surface 85 as the posterior surface wall of the gas compartment 30, there may be fewer surfaces to impact the visible light traveling through the display. Furthermore, the device will be lighter and cheaper to manufacturer.

Although the embodiment shown utilizes the electronic display surface 85, certain modifications and/or coatings (e.g., anti-reflective coatings) may be added to the electronic display surface 85, or to other components of the system in order to accommodate the coolant gas or to improve the optical performance of the device. In the embodiment shown, the electronic display surface 85 may be the front glass plate of a liquid crystal display (LCD) stack. However, almost any display surface may be suitable for embodiments of the present cooling system. Although not required, it is preferable to allow the cooling gas in the first gas chamber 30 to contact the electronic display surface 85 directly. In this way, the convective effect of the circulating gas will be maximized. Preferably the gas, which has absorbed heat from the electronic display surface 85 may then be diverted to the cooling plenum 45 where the collected heat energy in the gas may be dissipated into the air within the display housing 70 by conductive and or convective means.

To prevent breakage, the optional second surface glass 130 may be adhered to the front surface of glass 90. Alternatively, surface glass 90 may be heat tempered to improve its strength. As shown in FIG. 3, fan 50 propels a current of air around the loop (see arrows) of the isolated gas cooling chamber 20. The plenum 45 defining the second gas chamber 40 is adapted to circulate the gas behind the electronic display surface 85. The plenum 45 preferably surrounds most of the heat generating components of the electronic display, for example, backlight panel 140 (e.g., an LED backlight).

Figure 4:
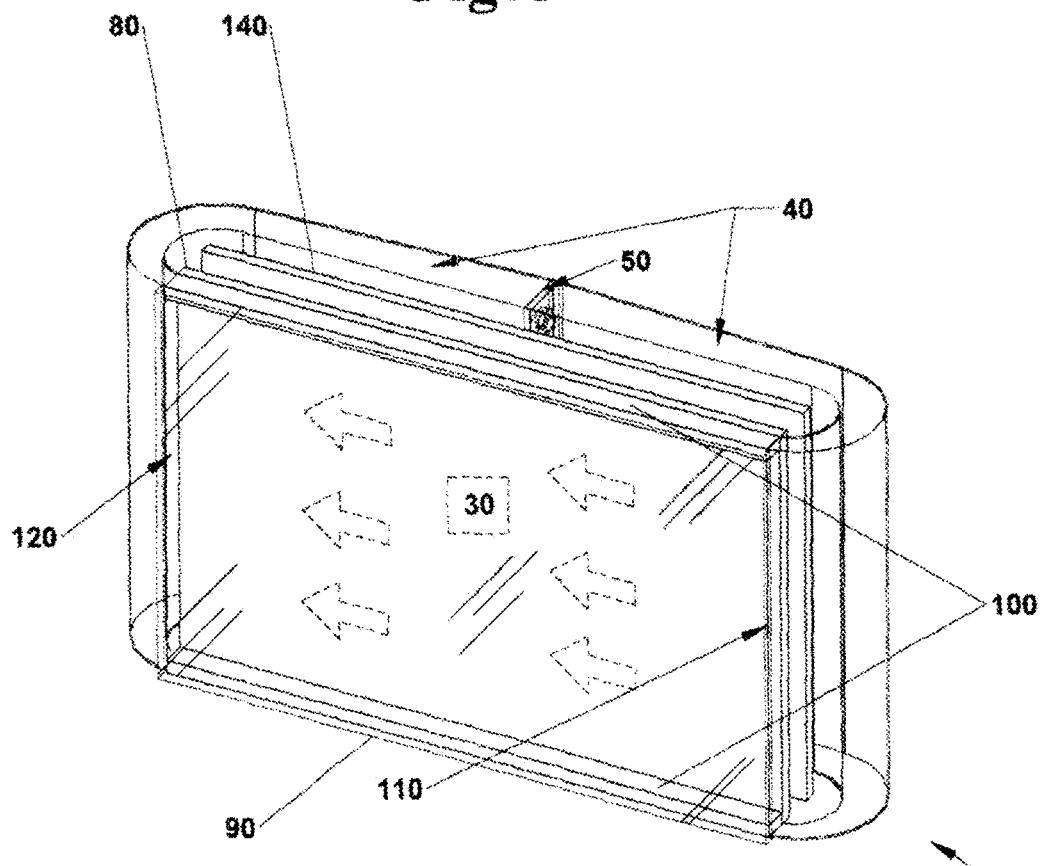
FIG. 4 is a front perspective view of an embodiment of the isolated cooling chamber, particularly the transparent anterior surface of first gas chamber.

FIG. 4 shows that the anterior surface 90 of the first gas chamber 30 is transparent and is positioned anterior to and at least coextensive with a viewable area of an electronic display surface 85. The arrows shown represent the movement of the isolated gas through the first gas chamber 30. As shown, the isolated gas traverses the first gas chamber 30 in a horizontal direction. Although cooling system 20 may be designed to move the gas in either a horizontal or a vertical direction, it is preferable to propel the gas in a horizontal direction. In this way, if dust or contaminates do enter the first gas chamber 30, they will tend to fall to the bottom of chamber 30 outside of the viewable area of the display. The system may move air left to right, or alternatively, right to left.

As is clear from FIG. 4, to maximize the cooling capability of the system, the first gas chamber 30 preferably covers the entire viewable surface of the electronic display surface 85. Because the relevant surfaces of the first gas chamber 30 as well as the gas contained therein are transparent, the image quality of the display remains excellent. Anti-reflective coatings may be utilized to minimize specular and diffuse reflectance. After the gas traverses the first gas chamber 30 it exits through exit opening 120. Exit opening 120 defines the entrance junction into the rear cooling plenum 45.

Figure 5:
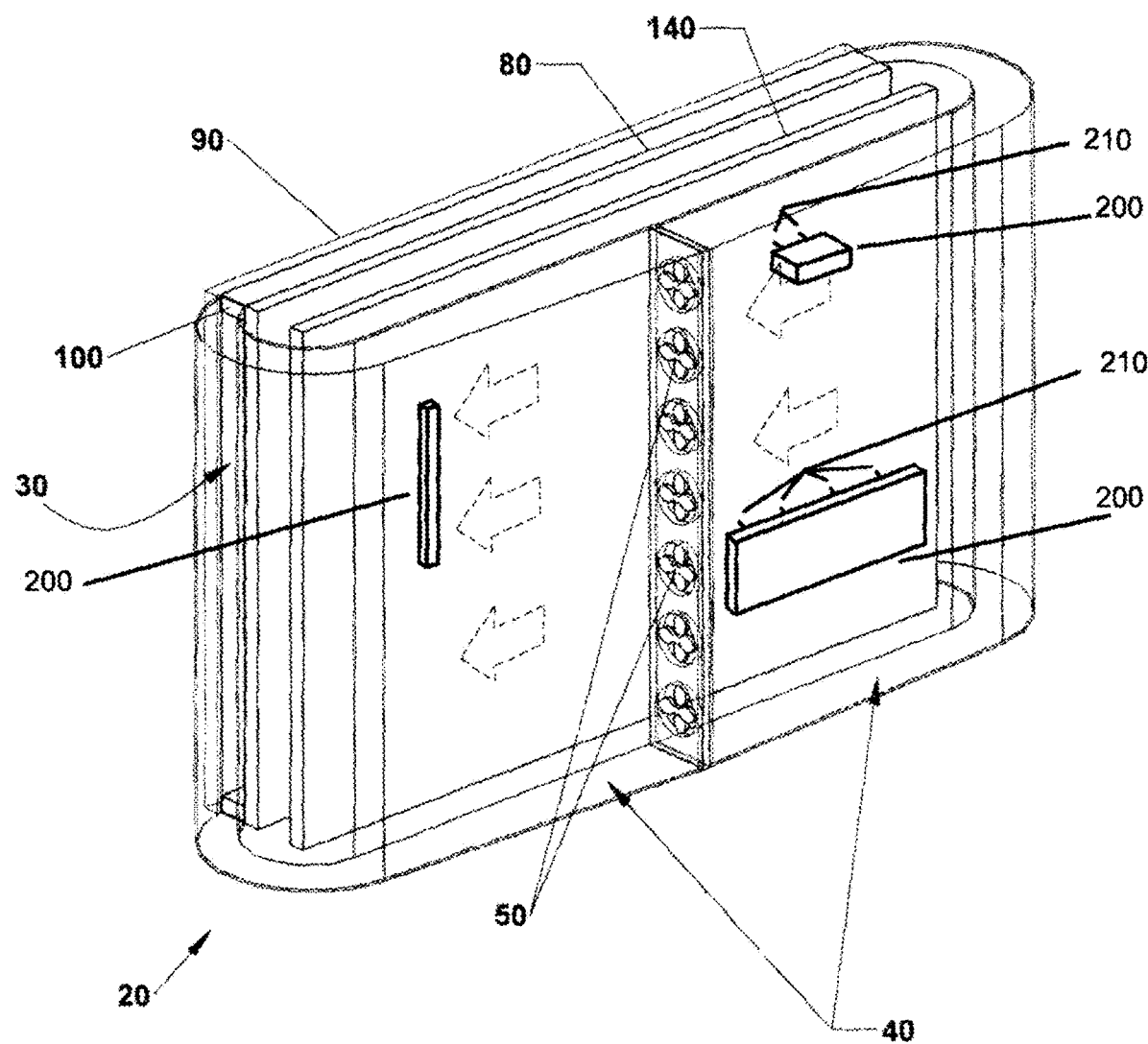
FIG. 5 is a rear perspective view of an embodiment of the isolated cooling chamber, particularly the cooling plenum.

FIG. 5 shows a schematic of the rear cooling plenum 45 (illustrated as transparent for explanation). One or more fans 50 within the plenum may provide the force necessary to move the isolated gas through the isolated gas cooling chamber. Various electronic components 200 can be located anywhere throughout the second gas chamber 40. Again, these components can be mounted directly on the walls of the chamber or supported on rods or posts 210. Thus, the cooling plenum 45 can be designed to not only take heat from the first gas chamber 30 but also to take heat from these various electronic components 200. Plenum 45 may have various contours and features to accommodate the internal structures within a given electronic display application.

Figure 6:
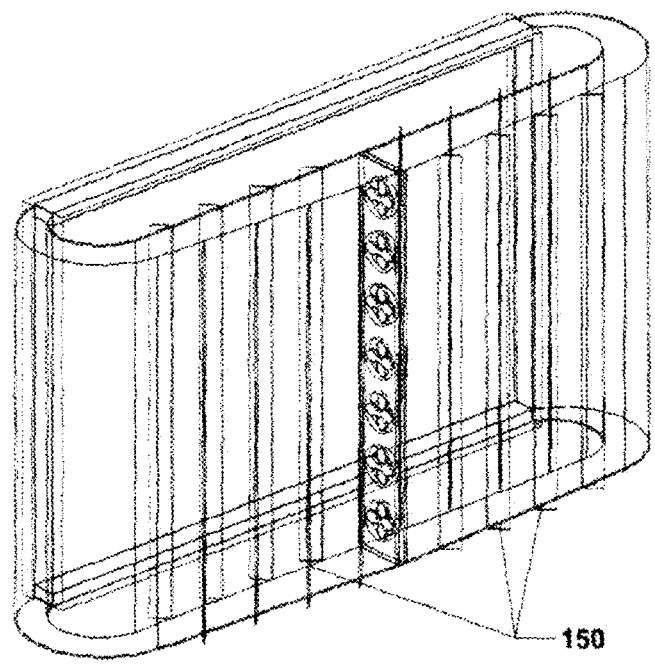
FIG. 6 is a rear perspective view of an embodiment of the isolated cooling chamber showing surface features that may be included on the plenum
Figure 7:
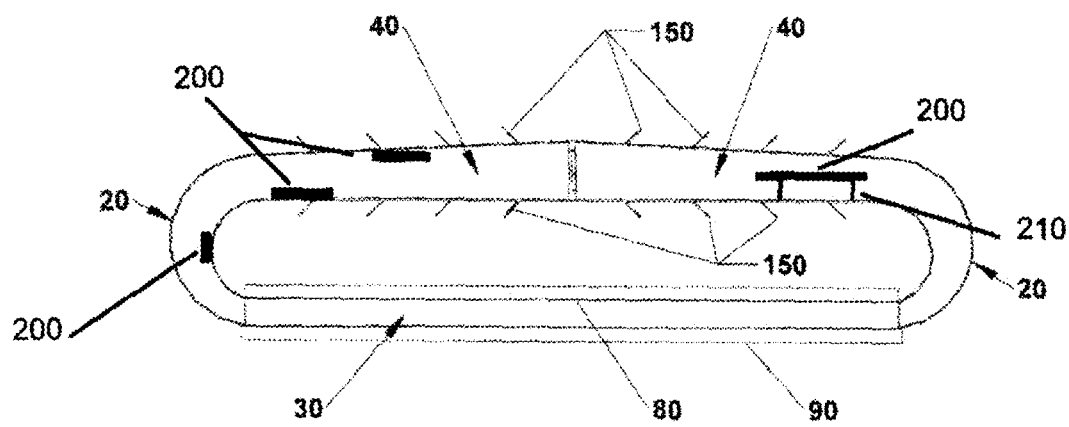
FIG. 7 is a top plan view of an exemplary embodiment of the cooling chamber showing surface features that may be included on the plenum.

As can be discerned in FIGS. 6 and 7, various surface features 150 may be added to improve heat dissipation from the plenum 45. These surface features 150 provide more surface area to radiate heat away from the gas within the second gas chamber 40. These features 150 may be positioned at numerous locations on the surfaces of the plenum 45. These features may be used to further facilitate the cooling of various electronic components 200 which may also be located within the plenum 45.

Figure 8:
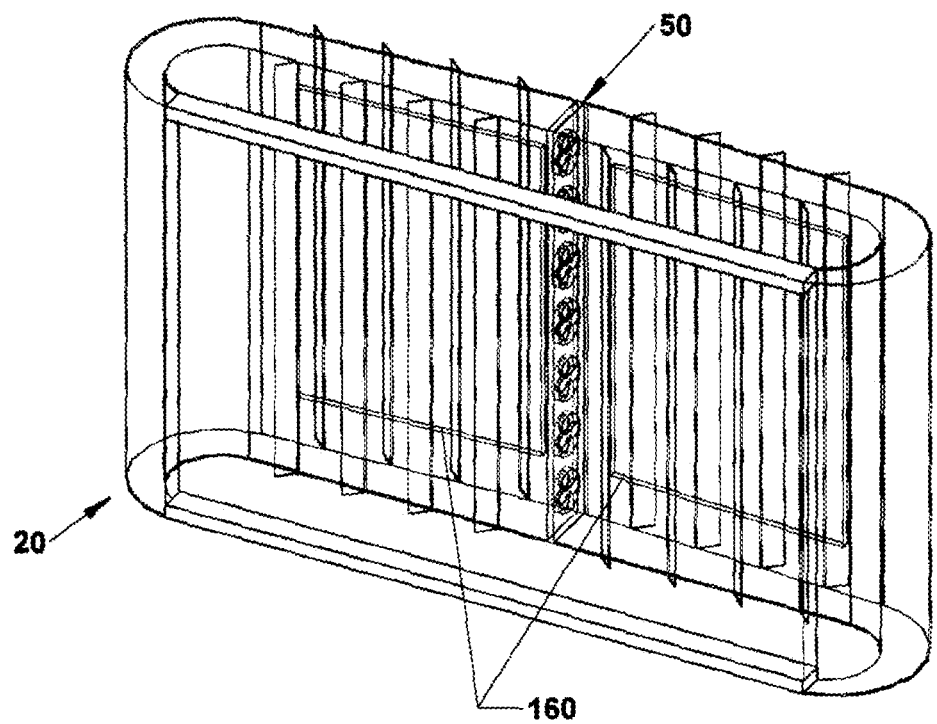
FIG. 8 is a front perspective view of an embodiment of the isolated cooling chamber with included thermoelectric modules.
Figure 9:
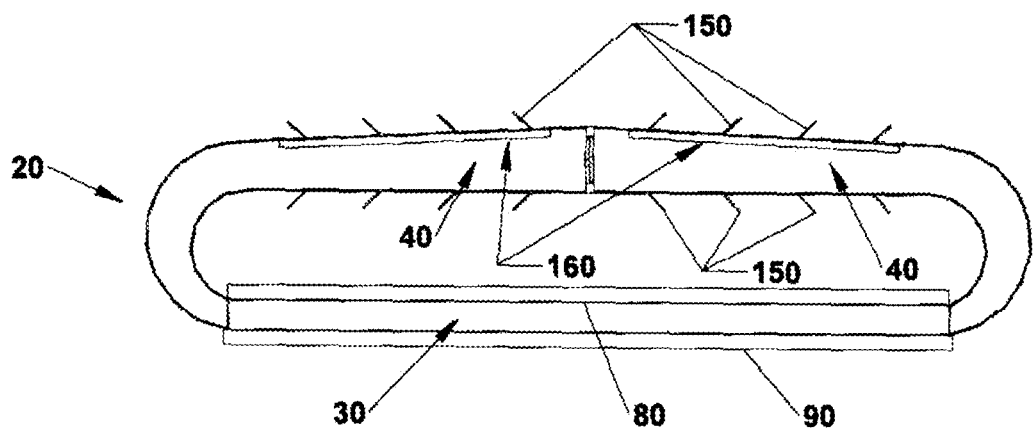
FIG. 9 is a top plan view of an exemplary embodiment of the cooling chamber with included thermoelectric modules.

Referring to FIGS. 8 and 9, one or more thermoelectric modules 160 may be positioned on at least one surface of the plenum 45 to further cool the gas contained in the second gas chamber 40. The thermoelectric modules 160 may be used independently or in conjunction with surface features 150. Alternatively, thermoelectric modules 160 may be useful to heat the gas in the rear plenum if the unit is operated in extreme cold conditions. Thermoelectric modules 160 may also be used to further facilitate the cooling or heating of various electronic components 200 which may also be located within the plenum 45.

Figure 10:
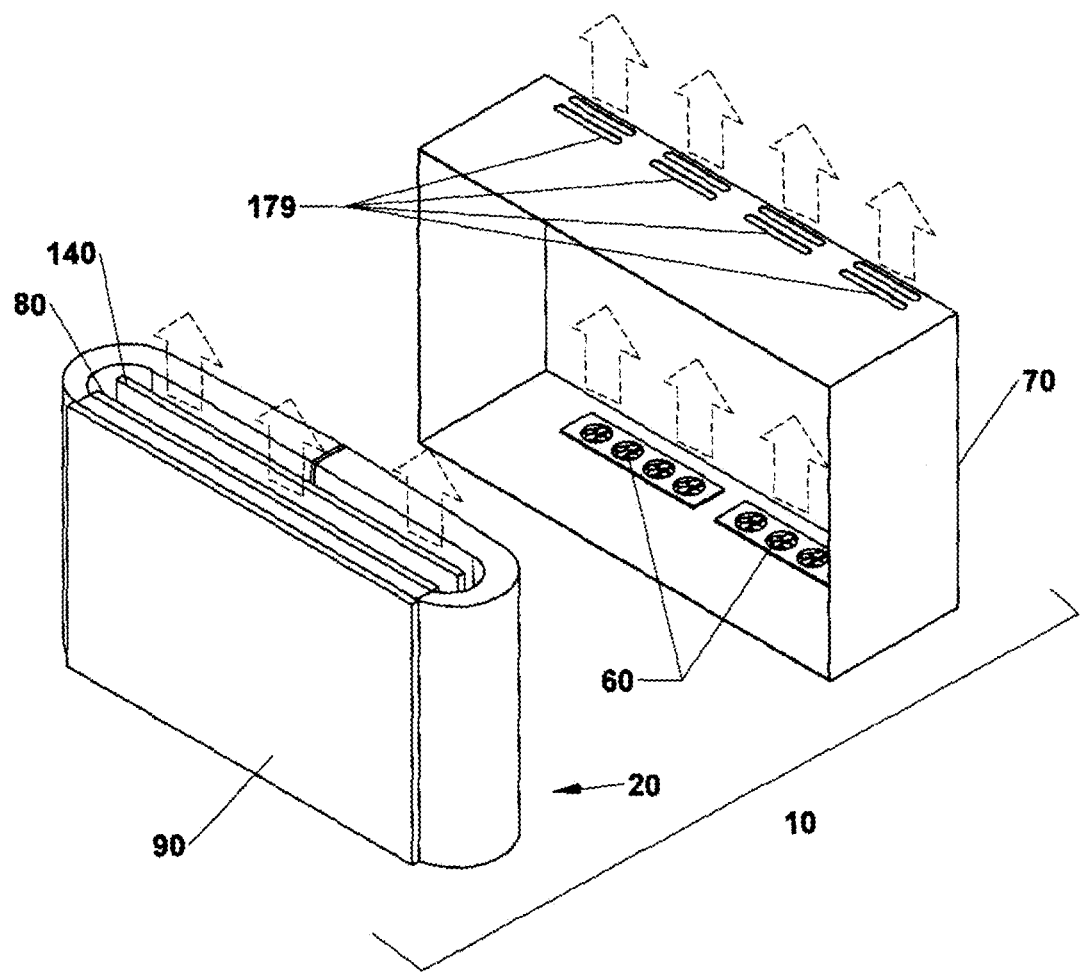
FIG. 10 is an exploded perspective view of an exemplary embodiment showing components of the isolated gas cooling system.

FIG. 10 shows an exemplary method for removing heat in the gas contained in the rear plenum 45. Fan 60 may be positioned to ingest external air and blow that air into the display housing 70. Preferably, the air will contact the anterior and posterior surfaces of the plenum 45. Furthermore, in this configuration, fan 60 will also force fresh air past the heat generating components of the electronic display (e.g., the TFT layer, backlight, transformers, circuit boards, resistors, capacitors, batteries, power transformers, motors, illumination devices, wiring and wiring harnesses, and switches) to further improve the cooling capability of the cooling system. The heated exhaust air may exit through one or more apertures 179 located on the display housing 70. In a preferred embodiment, the air from this external fan 60 should not enter the isolated cooling system as this would introduce dust and contaminates into the otherwise clean gas.

Besides thermoelectric modules 160, there are a number of ways to cool the gas in the second gas chamber. For example, air conditioners or other cooling means known by those skilled in the art may be useful for cooling the gas contained in plenum 45.

While the display is operational, the isolated gas cooling system may run continuously. However, if desired, a temperature sensor (not shown) and a switch (not shown) may be incorporated within the electronic display 10. The thermostat may be used to detect when temperatures have reached a predetermined threshold value. In such a case, the isolated gas cooling system may be selectively engaged when the temperature in the display reaches a predetermined value. Predetermined thresholds may be selected and the system may be configured with a thermostat (not shown) to advantageously keep the display within an acceptable temperature range.

An optional air filter (not shown) may be employed within the plenum to assist in preventing contaminates and dust from entering the first gas chamber 30.

Figure 11:
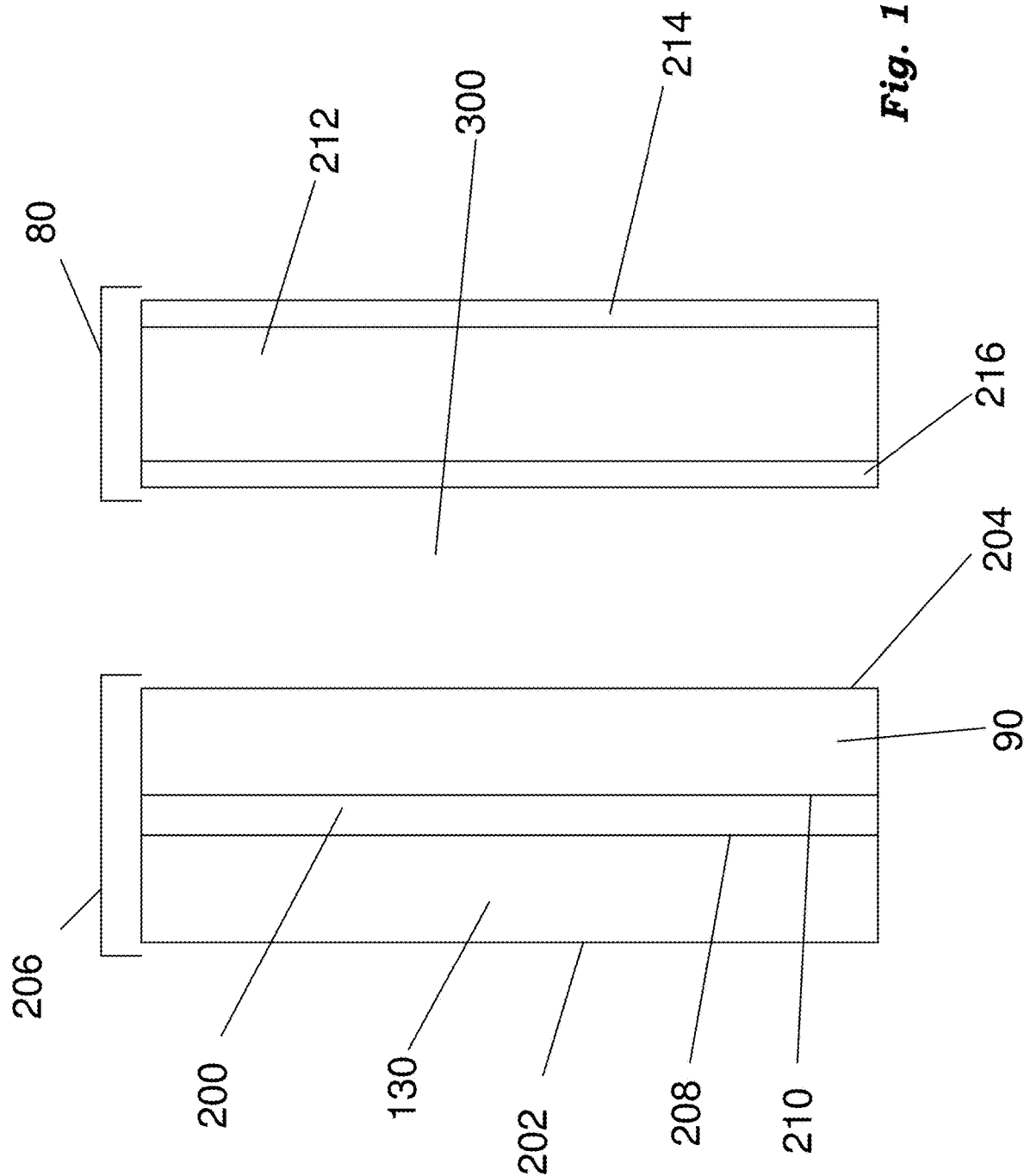
FIG. 11 is a cross-sectional view through one exemplary embodiment.

FIG. 11 is a cross-sectional view of an exemplary embodiment. In the arrangement shown, a first front glass 90 and a second front glass 130 may be laminated together. The first and second front glass 130 and 90 may be fixed to one another with a layer of index matched optical adhesive 200 to form a front glass unit 206. The first and second front glasses 130 and 90 may be laminated to one another through the process described in U.S. application Ser. No. 12/125, 046, which is incorporated herein as if fully rewritten. The LCD stack 80 may comprise an electronic display 212 interposed between a front polarizer 216 and a rear polarizer 214. In other embodiments, the LCD may be any layer or surface used to construct an electronic display. The LCD stack 80 and the front glass unit 206 define an insulator gap 300. The depth of the insulator gap 300 may be controlled by spacers 100 (shown in FIG. 2). The insulator gap 300 serves to thermally separate the front glass unit 206 from the LCD stack 80. This thermal separation localizes the heat on the front glass unit rather than allowing solar loading of the LCD stack 80. In some embodiments, the insulator gap 300 may be devoid of any gaseous material. In other embodiments, the insulator gap 300 may be the first gas chamber 30. In other embodiments, the insulator gap 300 may be filled with any substantially transparent gas.

The second front glass may have a first surface 202 and a second surface 208. The first surface 202 may be exposed to the elements; while the second surface 208 may be fixed to the first front glass 90 by the index matched optical adhesive 200. The first front glass may have a third surface 210 and a fourth surface 204. The third surface 210 may be fixed to the second front glass 130 by the index matched optical adhesive 200; while the fourth surface may be directly adjacent to the insulator gap 300. In some embodiments, to decrease the solar loading of the LCD stack 80 and improve the viewable image quality, an anti-reflective coating may be applied to the first surface 202 and the fourth surface 204. In other embodiments, the anti-reflective coating may only be applied to at least one of the first, second, third, or fourth surface 202, 208, 210, and 204.

FIG. 12 is a cross-sectional view of another exemplary embodiment of the front glass unit 206. In the arrangement shown, the front glass unit 206 comprises a second front glass 130, a layer of index matched optical adhesive 200, a linear polarizer 400, and a first glass surface 90. The linear polarizer 400 may be bonded to the first, second, third or fourth surface 202, 208, 210, and 204. The linear polarizer 400 may be aligned with the front polarizer 210 found in the LCD stack 80. The inclusion of a linear polarizer 400 in the front glass unit 206, further decreases the solar load on the LCD stack 80. The reduction in solar loading may significantly reduce the temperature of the electronic display.

The inclusion of the linear polarizer 400 may not affect the viewing angle of the electronic display or the chromaticity over angle. Another beneficial aspect of including the linear polarizer 400 is a reduction in specular reflection of the front glass unit 206 and the LCD stack 80 by approximately 50%.

Having shown and described preferred embodiments, those skilled in the art will realize that many variations and modifications may be made to affect the embodiments and still be within the scope of the claimed invention. Additionally, many of the elements indicated above may be altered or replaced by different elements which will provide the same result and fall within the spirit of the exemplary embodiments. It is the intention, therefore, to limit the invention only as indicated by the scope of the claims.

What is claimed is:

1. An electronic display assembly comprising:
    a housing;
    an electronic display located within the housing;
    a first airflow pathway extending through the housing between an intake and an exhaust;
    a second airflow pathway, separated from the first airflow pathway, and forming a closed, continuous pathway within the housing;
    a panel spaced apart from the electronic display and at least partially defining and separating the first and second airflow pathways, where at least a portion of the first airflow pathway extends between a rear surface of the electronic display and a forward surface of the panel, and where at least a portion of the second airflow pathway extends between a rear surface of the panel and a forward surface of a rear portion of the housing;
surface features extending from the panel into at least the first airflow pathway to enhance thermal transfer; and
one or more electronic components for operating the electronic display assembly located within the second airflow pathway.

2. The electronic display assembly of claim 1 wherein:
said electronic display comprises a liquid crystal type display (LCD) stack and a backlight panel;
said backlight panel is located rearward of the LCD stack and comprises a plurality of light emitting diodes for illuminating the LCD stack when activated.

3. The electronic display assembly of claim 2 wherein:
the first airflow pathway extends, at least in part, proximate to a rear surface of the backlight panel.

4. The electronic display assembly of claim 3 wherein:
the first airflow pathway extends directly along the rear surface of the backlight panel, at least in part.

5. The electronic display assembly of claim 4 wherein:
the first airflow pathway extends directly along the rear surface of the backlight panel with no intervening airflow pathways, at least in part.

6. The electronic display assembly of claim 5 wherein:
at least a portion of the first airflow pathway directly contacts the rear surface of the backlight panel.

7. The electronic display assembly of claim 2 further comprising:
a first set of one or more fans located at the first airflow pathway for moving ambient air through the first airflow pathway when activated; and
a second set of one or more fans located at the second airflow pathway for moving circulating gas through the second airflow pathway when activated.

8. The electronic display assembly of claim 7 wherein:
the panel is positioned a distance from the rear surface of the backlight panel to constrict a flow of the ambient air within the first airflow pathway against the rear surface of the backlight panel.

9. The electronic display assembly of claim 8 wherein:
the panel is positioned to increase a velocity of the flow of ambient air within the first airflow pathway along the backlight panel.

10. The electronic display assembly of claim 7 wherein:
the second airflow pathway comprises a rear chamber located behind at least a portion of the first airflow pathway; and
the first airflow pathway extends, at least in part, interior to the second airflow pathway, including interior to the rear chamber.

11. The electronic display assembly of claim 10 wherein:
the first airflow pathway, within the housing, comprises a first sub-pathway and a second, distinct sub-pathway.

12. The electronic display assembly of claim 11 wherein:
said first sub-pathway extends along the rear surface of the backlight panel; and
said second sub-pathway extends along a front surface of the backlight panel and a rear surface of the LCD stack.

13. The electronic display assembly of claim 1 wherein:
the panel provides, at least in part, a level of fluid separation between the second airflow pathway and the first airflow pathway which is sufficient to prevent particulate above a certain size from entering the second airflow pathway, but is less than a hermetic seal.

14. The electronic display assembly of claim 1:
wherein the second airflow pathway comprises a first portion located forward of the electronic display and a second portion located rearward of the electronic display; and
further comprising a cover panel located forward of the electronic display and forming part of the housing, said cover panel comprising multiple layers.

15. The electronic display assembly of claim 1 wherein:
the surface features comprise protrusions.

16. The electronic display assembly of claim 15 wherein:
the surface features comprise fins.

17. The electronic display assembly of claim 1 further comprising:
a first set of one or more fans located at the first airflow pathway; and
a second set of one or more fans located at the second airflow pathway, wherein the one or more electronic components comprise power supply components which supply power to both the electronic display and the one or more fans, and wherein said one or more electronic components are connected to the panel.

18. The electronic display assembly of claim 17 wherein:
the power supply components are configured to supply at least a majority of operational power for both the electronic display and the one or more fans.

19. The electronic display assembly of claim 18 wherein:
one or more electronic components are connected to the panel; and
said one or more electronic components comprise one or more of: a power module, a timing and control board, an electronic storage device, and a video card.

20. The electronic display assembly of claim 19 further comprising:
a temperature sensor located within the housing, wherein data from said temperature sensor is used to, at least in part, control operations of the first set of one or more fans and the second set of one or more fans.

21. The electronic display assembly of claim 1 further comprising:
a first set of one or more fans located at the first airflow pathway; and
a second set of one or more fans located at the second airflow pathway, wherein activation of the first set of one or more fans is configured to move ambient air, which is relatively cool, through the first airflow pathway to absorb heat generated by the electronic display during operation and absorb heat from relatively warm circulating gas within the second airflow pathway, wherein activation of the second fan is configured to move the relatively warm circulating gas through the second airflow pathway to absorb heat generated by the one or more electronic components during operation and disburse said absorbed heat to the relatively cool ambient air, and wherein said panel is spaced apart from the electronic display in a fashion such that a velocity of the ambient air within the first airflow pathway is increased within at least the portion of the first airflow pathway.

22. An electronic display assembly comprising:
a housing having an intake and an exhaust;
an electronic display located within the housing and comprising a liquid crystal display (LCD) stack and a backlight panel;

a first airflow pathway extending within the housing between the intake and the exhaust, said first airflow pathway extending, at least in part, along the backlight panel;

a first set of fans located along the first airflow pathway, which when activated, move ambient air through the first airflow pathway;

a second airflow pathway forming a closed, continuous pathway within the housing, and extending, at least in part, behind and spaced apart from, the electronic display and the first airflow pathway;

a second set of fans located along the second airflow pathway, which when activated, move circulating gas through the second airflow pathway;

a panel spaced apart from the backlight panel and providing a level of fluid separation between the first airflow pathway and the second airflow pathway such that the first airflow pathway extends, at least in part, forward of the panel, and the second airflow pathway extends, at least in part, rearward of the panel, the level of fluid separation being sufficient to prevent particulate above a certain size from entering the second airflow pathway, but is less than a hermetic seal; and electronic components for operating the electronic display assembly connected to a rear surface of the panel, said electronic components comprising one or more power supply components for supplying operational power to the electronic display, the first set of fans, and the second set of fans and one or more printed circuit boards for supplying electronic commands to the electronic display, the first set of fans, and the second set of fans for controlling operations of the same.

23. An electronic display assembly comprising:

a housing having an intake and an exhaust;

an electronic display located within the housing and comprising a liquid crystal display (LCD) stack and a backlight panel positioned behind the LCD stack for illuminating the LCD stack when activated;

a first airflow pathway extending within the housing from the intake, said first airflow pathway comprises multiple, distinct sub-pathways, each fluidly connected to the exhaust, wherein at least one of the sub-pathways extends along a rear surface of the backlight panel;

a first set of fans located along the first airflow pathway, which when activated, move ambient air through the first airflow pathway, including through each of the sub-pathways;

a second airflow pathway, separated from the first airflow pathway and defining continuous pathway within the housing, wherein said second airflow pathway extends, at least in part, behind and spaced apart from, the electronic display and the at least one of the sub-pathways which extends along the rear surface of the backlight panel;

a second set of fans located along the second airflow pathway, which when activated, move circulating gas through the second airflow pathway;

a panel spaced apart from the backlight panel and at least partially defining the first airflow pathway and the second airflow pathway such that the first airflow pathway extends, at least in part, between a forward surface of the panel and the rear surface of the backlight panel, and the second airflow pathway extends, at least in part, along a rear surface of the panel and forward of a rear surface of the housing, where said panel provides a level of fluid separation between the first airflow pathway and the second airflow pathway which is sufficient to prevent particulate within the ambient air in the first airflow pathway from entering the second airflow pathway but which is less than a hermetic seal;

surface features extending from the panel into at least the first airflow pathway to enhance thermal transfer;

electronic components for operating the electronic display assembly connected to the rear surface of the panel such that said electronic components are located within the second airflow pathway said electronic components comprising one or more power modules for supplying operational power to the electronic display, the first set of fans, and the second set of fans and one or more printed circuit boards (PCBs), for supplying electronic commands to the electronic display, the first set of fans, and the second set of fans for controlling operations of the same; and a temperature sensor located within the housing and electrically connected to at least one of the one or more PCBs, wherein said electronic commands provided to at least the first set of fans and the second set of fans are based, at least in part, on data received from said temperature sensor.

24. An electronic display assembly comprising:

a housing;

an electronic display located within the housing and comprising a liquid crystal type display (LCD) stack and a backlight panel, said backlight panel located rearward of the LCD stack and comprising a plurality of light emitting diodes for illuminating the LCD stack when activated;

a first airflow pathway extending through the housing between an intake and an exhaust;

a first set of one or more fans located at the first airflow pathway for moving ambient air through the first airflow pathway when activated;

a second airflow pathway, separated from the first airflow pathway, and forming a closed, continuous pathway within the housing;

a second set of one or more fans located at the second airflow pathway for moving circulating gas through the second airflow pathway when activated;

a panel spaced apart from the electronic display and at least partially defining and separating the first and second airflow pathways, where at least a portion of the first airflow pathway extends between a rear surface of the electronic display and a forward surface of the panel, and where at least a portion of the second airflow pathway extends between a rear surface of the panel and a forward surface of a rear portion of the housing; and one or more electronic components for operating the electronic display assembly located within the second airflow pathway.

25. The electronic display assembly of claim 24 wherein:

the one or more electronic components comprise power supply components which supply power to both the electronic display and the one or more fans, and wherein said one or more electronic components are connected to the panel.

* * * * *

UNITED STATES PATENT AND TRADEMARK OFFICE
CERTIFICATE OF CORRECTION

PATENT NO. : 12,207,452 B2  
APPLICATION NO. : 18/656927  
DATED : January 21, 2025  
INVENTOR(S) : Dunn Page 1 of 1

It is certified that error appears in the above-identified patent and that said Letters Patent is hereby corrected as shown below:

On the Title Page

Page 2 Column 2 In Item (56), References Cited, U.S. Patent Documents, please delete "7,212,403 B2 5/2007 Rockenfell" and insert -- 7,212,403 B2 5/2007 Rockenfeller --.

Signed and Sealed this  
Eleventh Day of March, 2025

Coke Morgan Stewart  
*Acting Director of the United States Patent and Trademark Office*